United States Patent [19]

Lin

[11] Patent Number: 5,721,439
[45] Date of Patent: Feb. 24, 1998

[54] MOS TRANSISTOR STRUCTURE FOR ELECTRO-STATIC DISCHARGE PROTECTION CIRCUITRY

[75] Inventor: Shi-Tron Lin, Taipei, Taiwan

[73] Assignee: Winbond Electronics Corporation, Taiwan, Taiwan

[21] Appl. No.: 630,127

[22] Filed: Apr. 10, 1996

[51] Int. Cl.$^6$ .......... H01L 27/10; H01L 29/76; H01L 29/94; H01L 31/062

[52] U.S. Cl. .......... 257/204; 257/379

[58] Field of Search .......... 257/204, 379

[56] References Cited

U.S. PATENT DOCUMENTS

| | | | |
|---|---|---|---|
| 5,250,823 | 10/1993 | Veendrick | 257/204 |
| 5,270,565 | 12/1993 | Lee et al. | |
| 5,378,919 | 1/1995 | Oohiai | 257/379 |

OTHER PUBLICATIONS

Mead et al, *Intro. to VLSI Systems* pp. 5-7, 1980.
Gadi Krieger, Nonuniform ESD Current Distribution Due to Improper Metal Routing, 1991 EOS/ESD Soymposium Proceedings, pp. 104-109.

*Primary Examiner*—Stephen Meier
*Attorney, Agent, or Firm*—Rabin, Champagne & Lynt, P.C.

[57] ABSTRACT

A MOS transistor structure for an electro-static discharge (ESD) protection circuit of an integrated circuit device. The ESD protection transistor has a structure that comprises a drain diffusion region formed in the silicon substrate of the integrated circuit device, a source diffusion region formed in the silicon substrate, a gate formed in the silicon substrate, and a number of isolated islands evenly distributed throughout the drain diffusion region. The isolated islands provide substantially uniform diffusion resistance between the drain contacts and the gate while increasing the diffusion resistance of the drain region to a level suitable for ESD current protection. The disclosed MOS transistor structure may be fabricated by a salicide technology-based fabrication procedure that is completely compatible with the salicide technology used for the making of the circuitry for the IC device.

25 Claims, 7 Drawing Sheets

MOS TRANSISTOR STRUCTURE FOR ELECTRO-STATIC DISCHARGE PROTECTION CIRCUITRY

BACKGROUND OF THE INVENTION

1. Field of the Invention

The invention relates in general to the semiconductor structural configuration of a metal-oxide semiconductor (MOS) transistor structure for an electro-static discharge (ESD) protection circuit in semiconductor integrated circuit (IC) devices. In particular, this invention relates to the configuration of a MOS transistor structure for an ESD protection circuit that is fabricated in the form of diffusion resistors, in semiconductor IC devices, for example in IC devices fabricated utilizing salicides in a self-aligned process.

2. Description of the Related Art

The N-type MOS transistor, either gate-grounded or gate-coupled, has been widely employed as the primary component for an ESD protection circuit in semiconductor IC devices. For example, in one U.S. Pat. No. 5,270,565, titled "Electro-static protection circuit with bimodal resistance characteristics", Alan Lee et al. proposed an ESD protection circuit employing MOS transistors as the protection means. The MOS transistors were, however, not made by a self-aligned fabrication procedure. FIG. 1a of the accompanying drawing is a schematic top view of the NMOS ESD protection transistors employed by Lee et al. for the protection circuitry. FIG 1B is a schematic diagram of the equivalent circuit of the ESD protection device of FIG. 1a.

As is seen in FIG. 1a, metallization 11 is utilized to connect the drain contacts 14, 15, 16 and 17 in the drain region of the transistor components, while metallization 12 is utilized to connect the source contacts 18, 19, 20 and 21 in the source regions. The area designated by reference numeral 13 includes the n⁺-diffusion drain region for the transistor structure, while reference numeral 13' designates the n⁺-diffusion source region. Normally, as is disclosed in the Lee et al patent, the drain contacts 14–17 are spaced apart from the edge of the gate 10 of the transistors or transistor structure at an interval of about several, for example, 5 μm (micrometers). This allows for the n-diffusion resistors to become a network type of distributed resistance, as is represented by the resistor network designated by reference numeral 22 in the schematic diagram of FIG. 1b. The functionalities of the distributed resistance network 22 may be summarized as follows:

First of all, when there is an ESD event, the distributed resistance network allows the discharge current coming from the drain region of the MOS protection transistor structure to flow in an evenly distributed manner toward the source region.

Secondly, when transient current in the ESD event flows into a weak spot proximate to the gate of the transistor structure, the distributed resistance network increases the electrical potential in the proximity of the weak spot, thereby preventing device damage from occurring as the result of local thermal stress.

A conventional layout of the ESD protection transistor structure designed to evenly distribute the ESD current from drain to source, is shown in FIGS. 2a and 2b. FIG. 2a schematically shows a top view of a conventional layout of NMOS ESD protection transistor structure for the protection circuit, and FIG. 2b is a schematic diagram of the circuit device of FIG. 2a.

As persons skilled in the art are aware, the lead pins of an IC device provide the paths for the commencement of ESD events in IC devices as a result of existing static electric potentials. To provide necessary protection, an ESD protection MOS transistor network is normally implemented inside the IC package between the wire-bonding pad for each of the IC lead pins and the circuitry just behind. As is seen in FIG. 2a, the wire-bonding pad 25, which allows for IC circuitry carried on a die to be connected to the leadframe of the chip carrier, is itself connected to the drain contacts of the protection MOS transistor structure. On the other hand, the source contacts of the ESD protection MOS transistor structure are connected to the device ground voltage $V_{SS}$, indicated generally as a point 27 in the drawing.

To distribute the ESD current internal to the protection MOS transistor structure in case of an ESD event, the connection of the source contacts of the ESD protection MOS transistor structure to the device ground point 27 must be physically arranged at a location diagonally opposite to the location of the bonding pad 25, as is shown for example in FIG. 2a. This allows for the substantially even distribution of the ESD current I during an ESD event, as is schematically shown by phantom-line arrows in FIG. 2a and solid arrows in FIG. 2b respectively.

If, however, the location at which each source contact of the ESD protection MOS transistor structure is physically connected to the ground point 27 is not substantially diagonal to the location of the bonding pad 25, as is depicted schematically in FIG. 3, then an even distribution of the ESD current I during an ESD event cannot be expected. This is schematically represented in FIG. 3 by the unevenly distributed phantom-line arrows that represent the distribution of the ESD current I. The locations of connection to both the bonding pad 25 and the ground point 27 in the example of FIG. 3 are biased to the left side of the ESD protection MOS transistor structure.

Differences in behavior of the ESD current caused by the effects of differing layouts such as are illustrated in FIGS. 2a and 3 are discussed, for example, in the 1991 EOS/ESD Symposium Proceedings. At pp. 104–109, Gadi Krieger et al. discuss the phenomena in their paper "Nonuniform ESD Current Distribution Due To Improper Metal Routing", which is incorporated herein by reference.

As feature sizes of semiconductor IC devices are being reduced to the sub-micron level, one of the guiding design rules for making high-speed ICs is to employ self-aligned silicide (salicide) fabrication procedures to make the MOS transistor components. The aim is to effectively reduce the sheet resistance in the source/drain regions, so that the fabricated MOS transistors may operate at higher speeds. However, the use of salicides for the high-speed device circuits results in the problem of maintaining adequate ESD protection for such circuits in these IC devices. Essentially, if the ESD protection circuits are also implemented in the same salicide category of fabrication technology, then the sheet resistance in the n⁺-diffusion regions for the ESD protection circuits will fall from the traditional range of about 60 Ω per-square to about 2–3 Ω per-square. Taking, for example, the layout of FIG. 1a, the resistance in the n⁺-diffusion drain region inside region 13 falls from about 300 Ω to about 10–15.

The direct result of this resistance reduction in the ESD protection components is obvious: Most importantly, the effectiveness of the ESD protection for the circuitry behind the protection circuit is reduced three to five times. Essentially, the effective ESD protection for IC devices is so much reduced as to be considered ineffective in some occasions. For example, a device may sustain only 600 V instead of the required 2 KV. Moreover, a result of the degradation of ESD protection capability is the great possibility that the gate oxide layer in the MOS transistor structure may be ruptured due to the presence of high electric field intensity caused by ESD. Or, the less-than-effective protection against ESD may cause the source and drain regions of the MOS transistor structure to be short-circuited.

David Krakauer et al. proposed a solution to the problem, in the paper "ESD Protection in a 3.3 V Sub-Micron Silicided CMOS Technology" published in the 1992 EOS/ESD Symposium Proceedings. Krakauer et al. proposed to cover a region proximate to within 3.0 μm to the edges of transistor channel regions of the ESD protection circuitry, utilizing a photomask before the implementation of the salicide fabrication procedure. This allows an increase of the resistance in the $n^+$-diffusion drain region (region 13 in FIG. 1a); however, there are still some obvious disadvantages: Due to the use of an additional photomask layer, the complexity, as well as the cost of the device fabrication, are increased.

SUMMARY OF THE INVENTION

It is therefore an objection of the invention to provide an MOS transistor structure for an ESD protection circuit in IC devices that is compatible with self-aligned silicide fabrication technology, without having to resort to a different fabrication process for the protection circuitry that complicates the process of IC device fabrication.

It is another object of the invention to provide a MOS transistor structure for an ESD protection circuit in an IC device, that employs distributed resistance in the drain, using self-aligned silicide fabrication technology, in terms of the spatial effect obtained within the region between the edge of the transistor gate and drain.

It is still another object of the invention to provide a MOS transistor structure for an ESD protection circuit in an IC device, that allows for an even distribution of ESD current from the wire-bonding pad to the device ground.

The invention achieves these objects by providing a MOS transistor structure for an ESD protection circuit in an integrated circuit device, that comprises a drain diffusion region formed in the silicon substrate of the integrated circuit device, a source diffusion region formed in the silicon substrate, a gate formed in the silicon substrate, and a number of isolated islands evenly distributed in the drain diffusion region. The isolated islands increase the diffusion resistance of the drain region to a level suitable for use as the ESD current protection means. The disclosed MOS transistor structure may be fabricated in a salicide technology-based fabrication procedure that is completely compatible with the salicide technology used for the making of the circuitry for the IC devices.

BRIEF DESCRIPTION OF THE DRAWINGS

Other objects, features, and advantages of the invention will become apparent by way of the following detailed description of the preferred but non-limiting embodiments. The description is made with reference to the accompanying drawings in which:

FIG. 1b shows an equivalent circuit of the ESD protection circuit of FIG. 1a;

FIG. 2b shows an equivalent circuit of the ESD protection circuit of FIG. 2a;

DESCRIPTION OF THE PREFERRED EMBODIMENTS

Figure 1A:
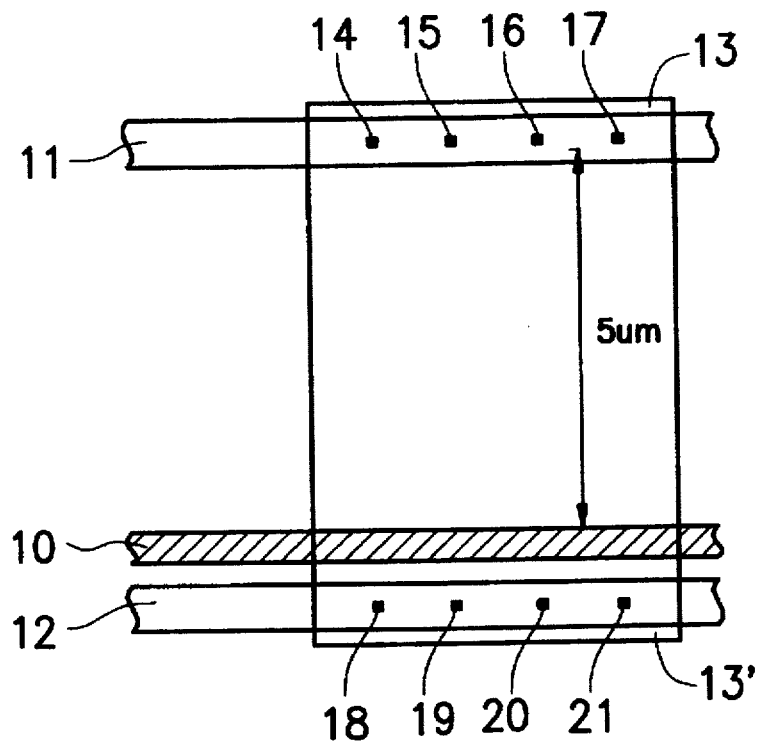
FIG. 1a is a schematic top view of a conventional NMOS ESD protection transistor structure employed in a protection circuit.
Figure 1B:
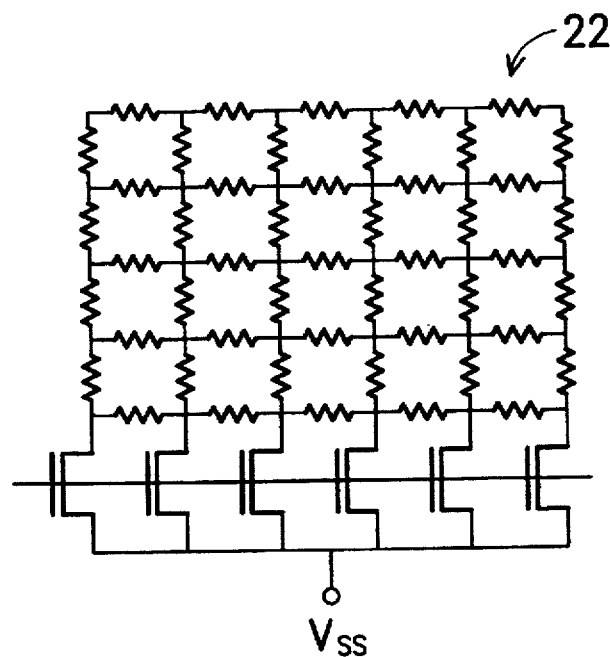
Figure 2A:
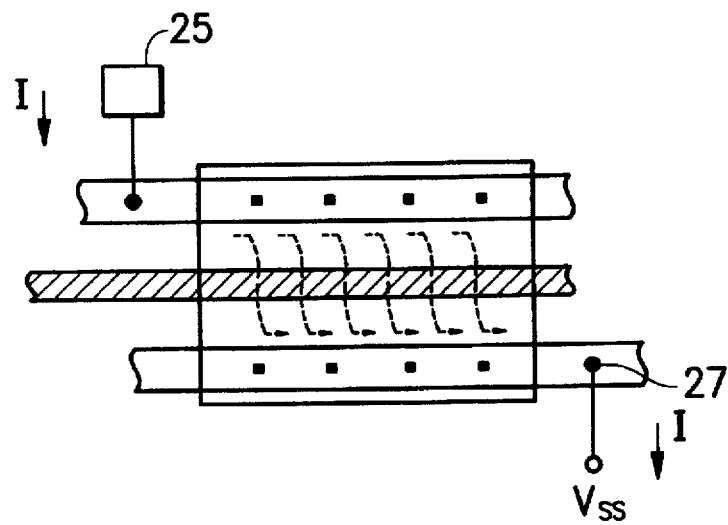
FIG. 2a is a schematic top view of the layout of a conventional protection circuit.
Figure 2B:
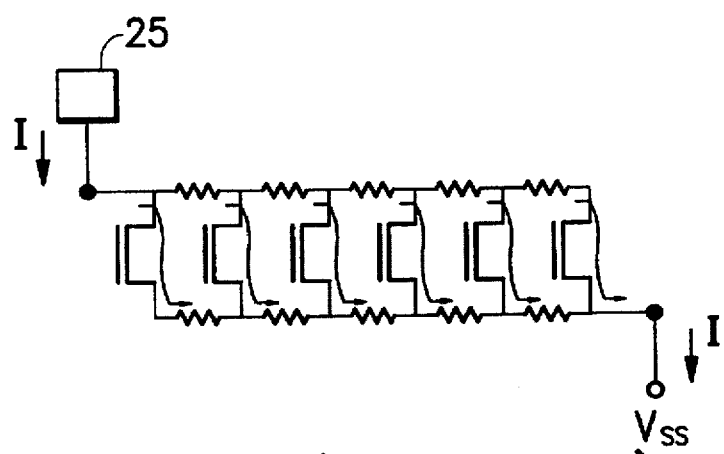
Figure 3:
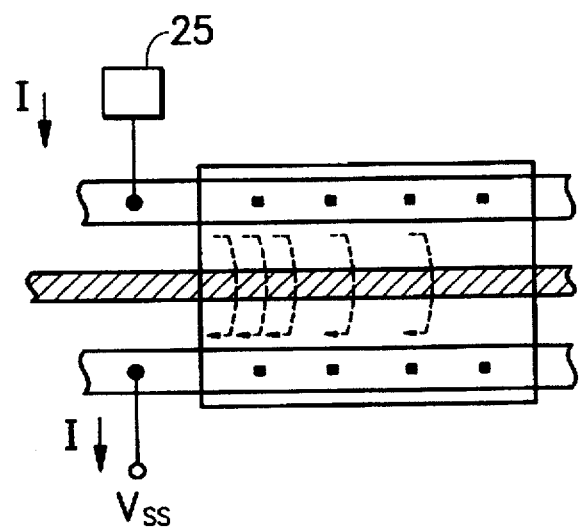
FIG. 3 is a schematic top view of an inadequately-arranged layout of a conventional protection circuit.
Figure 4A:
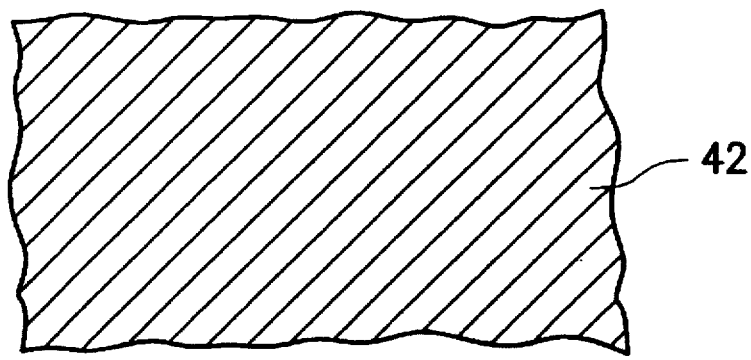
FIGS. 4a–4c are respectively schematic top views of the semiconductor structural configuration of an ESD protection MOS transistor structure in accordance with a first embodiment of the invention, at selected process stages of its fabrication.
Figure 4B:
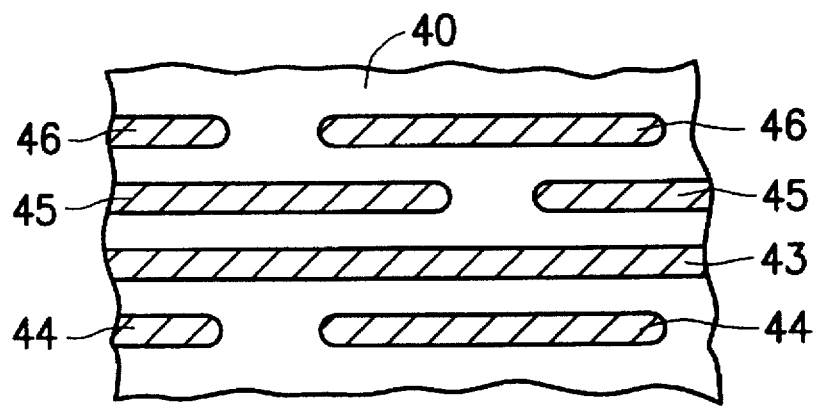
Figure 4C:
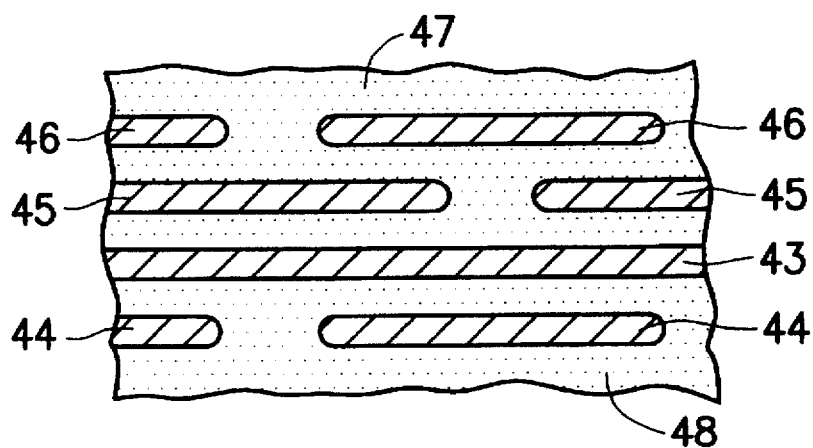

FIGS. 4a–4c and FIGS. 5a–5c illustrate a first embodiment of the invention. FIGS. 4a–4c respectively show top views of the ESD protection MOS transistor structure of the first embodiment in a protection circuit at selected stages of its fabrication, and the corresponding FIGS. 5a–5c respectively show cross-sectional views thereof. Since the ESD protection MOS transistor structure are the subject matter of the invention, the description will concentrate on the transistor structure, all other relevant portions in the protection circuit will not be described in full detail, since they are well known to persons skilled in the art.

Figure 5A:
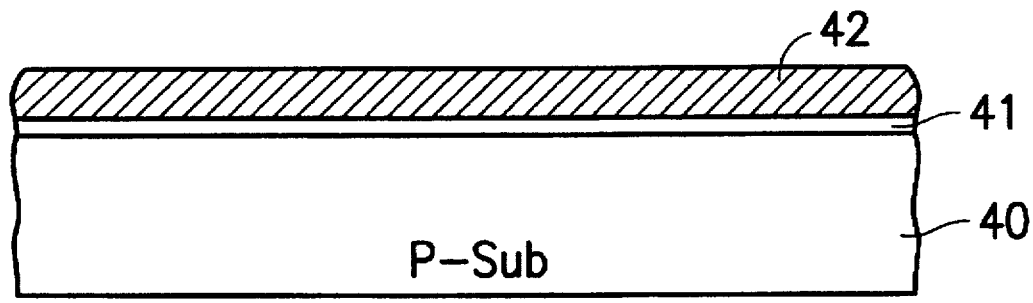
FIGS. 5a–5c are cross-sectional views corresponding to the respective top views of FIGS. 4a–4c.
Figure 5B:
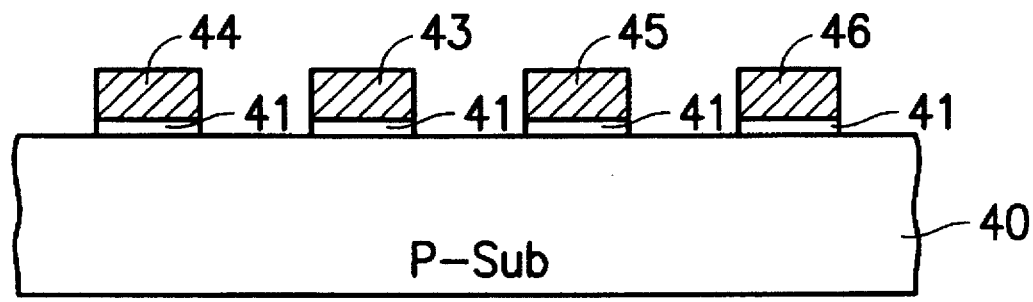
Figure 5C:
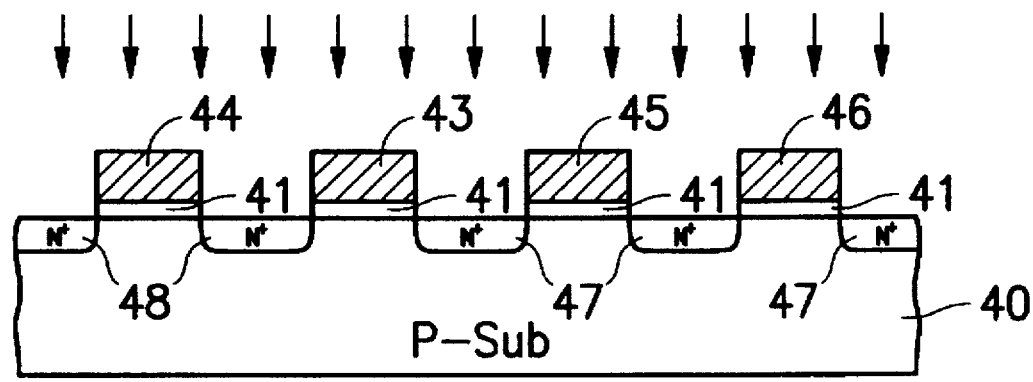

As is seen in FIGS. 4a and 5a, the process of fabricating the ESD protection MOS transistors according to the first embodiment of the invention involves first successively forming an oxide layer 41 and a polysilicon layer 42 on a P-type silicon substrate 40. Then, as is shown in FIGS. 4b and 5b, a photolithography procedure is employed to form a plurality of floating polysilicon islands 44, 45 and 46 and a polysilicon gate 43 that takes the form of a long strip. Finally, as is seen in FIGS. 4c and 5c, an ion implantation procedure is employed to form the $n^+$-diffusion drain region 47 and $n^+$-diffusion source region 48, respectively. At this stage, it can be seen that the plurality of floating polysilicon islands 44, 45 and 46 are formed along both sides of the strip-shaped polysilicon gate 43 and can be combined with the oxide layer 41 underneath to constitute the isolated island configurations of the invention having the functions to be described in detail in the following paragraphs.

Meanwhile, it is important to point out that the fabrication procedural steps described above for the making of the isolated island configurations are completely compatible with the semiconductor fabrication procedural steps for the making of the silicided diffusion or salicided CMOS technology-based components. As persons skilled in the art will well appreciate, this allows for both the ESD protection circuits and the core circuits in the subject IC device to be fabricated in the same technology. This means reduced fabrication complexities as well as reduced costs, as will be explained in further detail below. Further, the process of the present invention is as well also compatible with the semiconductor fabrication procedural steps for the making of the silicided CMOS technology-based components, for example, components with silicided source and drain.

Figure 6A:
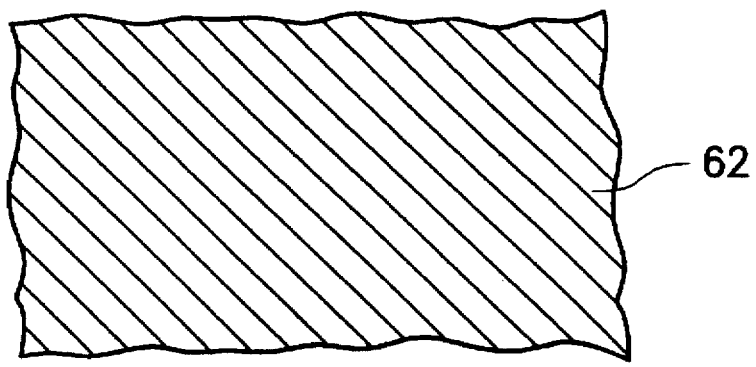
FIGS. 6a–6c are respective schematic top views of the semiconductor structural configuration of an ESD protection MOS transistor structure in accordance with a second embodiment of the invention, at selected process stages of its fabrication.
Figure 6B:
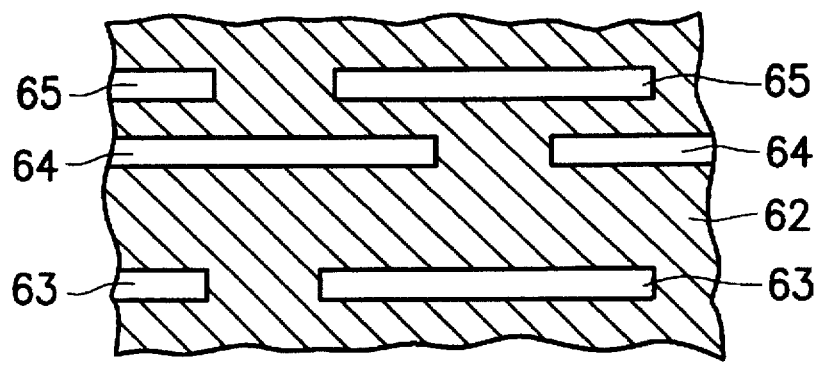
Figure 6C:
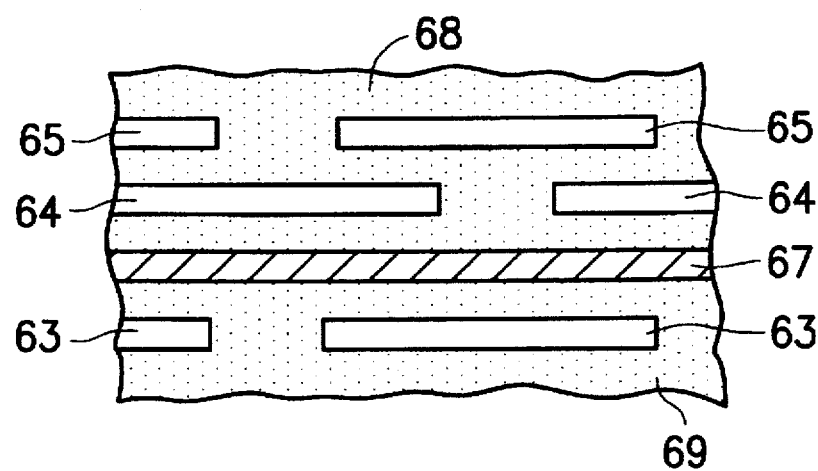
Figure 7A:
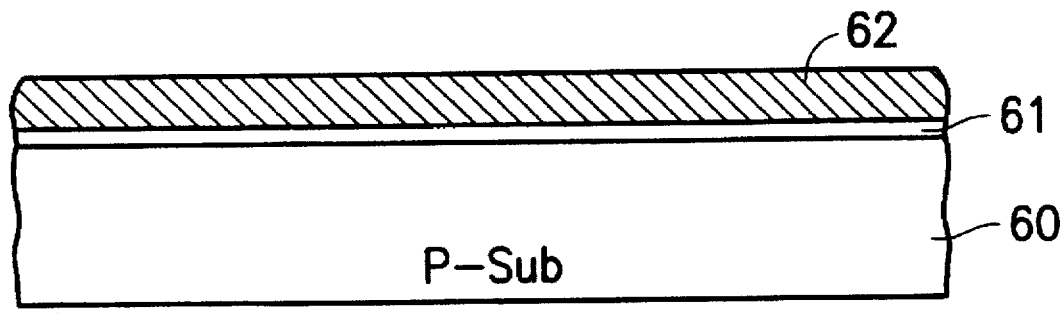
FIGS. 7a–7c are the cross-sectional views corresponding to the respective top views of FIGS. 6a–6c.
Figure 7B:
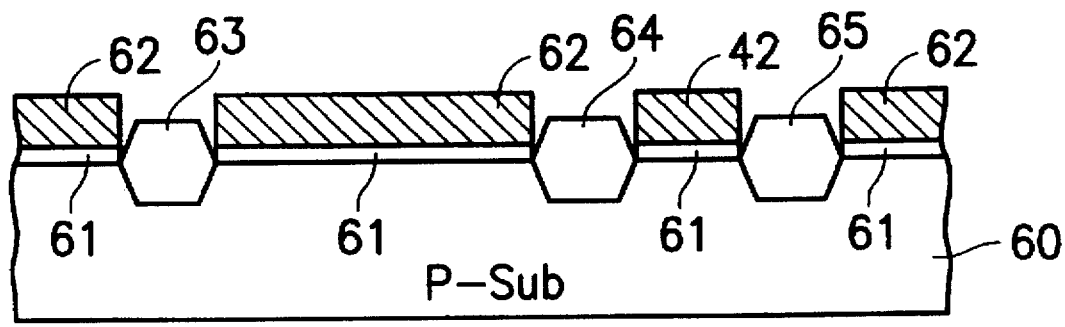
Figure 7C:
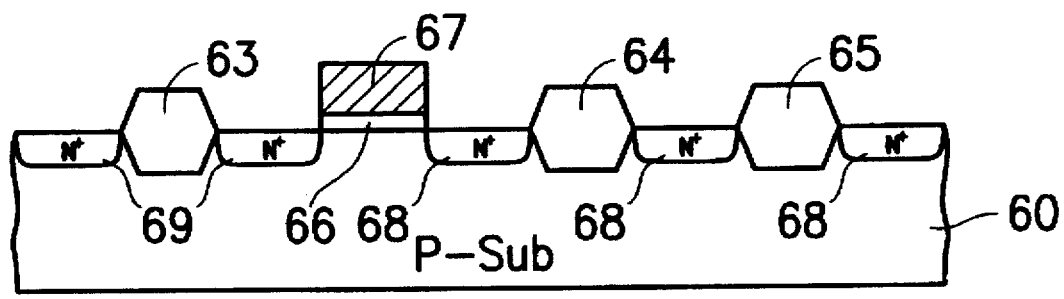

A second preferred embodiment of the invention is now described with reference to FIGS. 6a–6c and 7a–7c. FIGS. 6a–6c are top views of the semiconductor structural configuration of the ESD protection MOS transistor in accordance with the second embodiment at selected stages of its process of fabrication. FIGS. 7a–7c are cross-sectional views corresponding to the respective top views of FIGS. 6a–6c.

As is seen in FIGS. 6a and 7a, the process of fabricating the ESD protection MOS transistor structure for this second embodiment involves forming in succession a pad oxide layer 61 and a nitride layer 62, on a P-type silicon substrate 60. Then, as is shown in FIGS. 6b and 7b, a photolithography procedure is employed to form the planned field oxide region by etching away the areas of nitride layer 62 and pad oxide layer 61 exposed beyond the shielding of the mask layer. Then, a number of field-oxide islands 63, 64 and 65, forming a field oxide layer of the transistor, may be formed by, for example, a LOCOS (local oxidation of silicon) procedure. Next, as shown in FIGS. 6c and 7c, an etching procedure is utilized to remove the pad oxide layer 61 and the nitride layer 62. This is followed by formation of a gate oxide layer 66 and the formation of a polysilicon layer 67 as a gate, by another photolithography procedure. Finally, an ion implantation procedure is employed to form the $n^+$-diffusion drain region 68 and the $n^+$-diffusion source region 69.

In a manner similar to that used to produce the first embodiment described above, the field-oxide islands 63, 64 and 65 formed along both sides of the gate 67 for the transistor structure, constitute an isolated island configuration of the invention. The functionalities of these isolated island configurations as an ESD protection means, likewise, will be described in detail in the following paragraphs.

And, again, the fabrication procedural steps described above for the making of the isolated island configurations of the second embodiment are compatible with the semiconductor fabrication procedural steps for salicided, as well as silicided, CMOS technology-based components. This ensures reduced overall fabrication complexity and costs.

Figure 8:
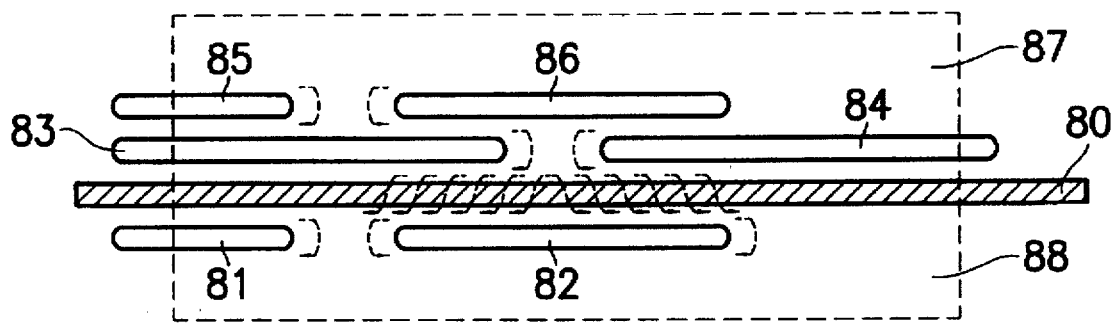
FIG. 8 is a schematic top view of a third embodiment of the invention.

Referring next to FIG. 8, there is shown a schematic top view of a third embodiment of the invention. A number of isolated islands 81–86 are arranged in multiple rows. In each row, a plurality of isolated islands are aligned along the longitudinal direction of the islands themselves, and each isolated island in a row is in relative interleaving relationship with the proximate islands in the neighboring rows at both sides (both above and below). The center of each island in a row is substantially aligned with the center of an isolating space between two consecutive islands in the two rows adjacent to its sides. For example, as is seen in the drawing, the center of island 86 is aligned with the center of the isolating space between islands 83 and 84. In this embodiment, all the islands 81–86 are substantially the same size in terms of both width and length. This allows for a symmetric alignment in the interleaving relationship of isolated islands in the respective rows. Further, the active pitch of the islands in each row of islands is equal to about twice the distance between any two neighboring rows, as well as twice the distance between the edge of the gate 80 and the first row of islands immediately next to it.

The ESD protection transistor structure fabricated in this layout configuration as described above can enjoy a substantially more even ESD current distribution during an ESD event. Due to the uniformly spread distribution of the isolated islands, ESD current is distributed along the equivalently shaped resistance gridwork, as is schematically indicated by the phantom-line arrows shown in FIG. 8. The ESD current flows from the drain region 87, evenly distributed in the gridwork of isolated islands, through under the gate 80, and into the source region 88, again evenly distributed in the gridwork of isolated islands. As can be observed in FIG. 8, the ends of the strip-shaped isolated islands are tapered. This prevents the current-crowding effect at sharp corners, as is well known in the art.

Figure 9:
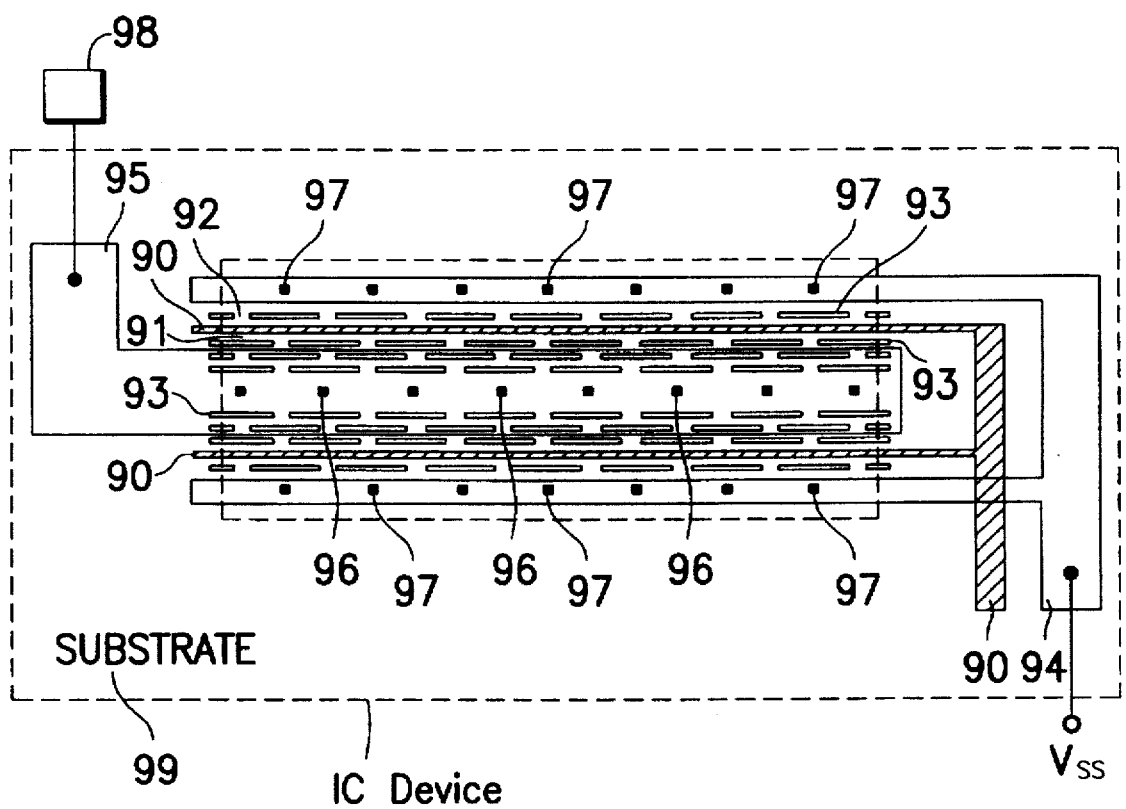
FIG. 9 is a schematic view of a layout of a fourth embodiment of the invention.

A fourth embodiment of the invention is now described. Referring to FIG. 9, wherein a top view of an IC device 99 containing the layout of the fourth embodiment is shown, it can be observed that metallization 95 is employed for connecting drain contacts 96 of the ESD protection transistor structure in a gridwork of isolated islands 93. One end of the metallization 95 is connected to a wire-bonding pad 98 of the device die, via metallization 95. On the other hand, metallization 94 is used to connect the source contacts 97 of the transistor structure, and is further connected at one end to the device ground potential plane, that is, $V_{SS}$.

In this embodiment, the drawing depicts three rows of isolated islands arranged between the row of drain contacts 96 and a gate strip 90. As described above, these three rows of isolated islands are aligned in a relative interleaving manner when the isolated islands in one row are compared with those in adjacent rows on both sides. The isolated islands are formed in an $n^+$-diffusion drain region 91 of the ESD protection transistor structure, as is described above with respect to the first, second, and third embodiments. One row of isolated islands 93 is arranged between the row of source contacts 97 and the gate strip 90 within the $n^+$-diffusion source region 92 of the ESD protection transistor structure.

As one embodiment example, the dimensions in the layout of the constituent portions of the ESD protection transistor structure as outlined in the above fourth embodiment of FIG. 9, may be specified as follows:

The isolated islands 93 should each have a length of about 8.5 µm and a width of about 0.75 µm.

The pitch of the isolated islands in each row should be about 10 µm, including a spacing of 1.5 µm between the consecutive 8.5 µm-long isolated islands.

The distance between two consecutive rows of isolated islands, and the distance from the last row of islands to the gate strip 90 each should be about 0.75 µm.

Upon occurrence of an ESD event, the discharged current will start flowing along the metallization 95 that is connected at its one end to the wire-bonding pad of the device die, distribute along the row of drain contacts 96 and into the gridwork of isolated islands that comprise a portion of the ESD protection transistor structure, collect at the metallization 94 via the row of source contacts 97 connected thereto, and finally flow to the device ground potential $V_{SS}$. In the gridwork of isolated islands, the ESD current will be evenly distributed just as was described above with reference to the embodiment of FIG. 8. Essentially, the ESD current will route around the islands and flow from the drain contacts 96 toward the gate 90.

In this embodiment having the physical dimensions as exemplified above, each of the distributed ESD current portions for the corresponding ESD protection transistor will be conducted over a path having an equivalent resistance of about 20 ☐ (squares) of sheet resistance, which is 40–60 Ω (assuming sheet resistance is 2–3 Ω/☐. In this same example, where the ESD current may be divided along both sides of the center metallization 95 toward the two gridworks of ESD protection transistor structure above and below as shown in the drawing, the entire protection circuit may have a diffusion resistance of about 10 ☐, which is the equivalent of parallel connection of the two gridworks of 20 ☐ each. These resistance values are, of course, evaluations based on the above dimensional figures. Minor discrepancies may be expected when such a device is actually fabricated, as will be appreciated by persons skilled in the art.

Thus, for each 10 μm width of the gate 90 resulting in the 10 ☐ of diffusion resistance, it is equivalent to having a diffusion resistance of about 100 ☐ for each 1 μm width of the gate 90. Since the sheet resistance of transistors fabricated with the salicide technology-based process is about 2–3 Ω per-square as mentioned above, therefore, with a diffusion resistance of 100 ☐, the resistance will amount to about 200–300 Ω, which is the same order as a non-silicided $n^+$diffusion resistance per μm channel width with diffusion contacts 5 μm away from the gate edge. As persons skilled in the art can appreciate, different values of diffusion resistance can be obtained by adjusting the length and width of the isolated islands, the distance between the rows of islands, as well as the pitch of islands in a row, etc. The physical dimensions in the embodiment of FIG. 9 are, therefore, only exemplary and not intended to limit the scope of the invention.

The present invention also applies to general silicided source/drain diffusion process, i.e., not limited to self-aligned silicidation process-salicided process. And for example, the pitch of the isolated islands can be made in the range of 2 μm–15 μm. Based on the embodiments described above, it is therefore apparent that the MOS transistor structure for ESD protection circuitry of the invention has at least the following advantages, since the same salicide technology for the core circuitry of an IC device may be employed for the fabrication of the ESD protection circuit:

1. The process is simplified without the additional salicide blocking step. No increased cost would result due to this added advantage.

2. A desired value of diffusion resistance in the protection circuitry may be easily obtained by suitably adjusting the physical dimensions in the isolated islands for the protection circuit.

3. A more even distribution of ESD current is obtained during an ESD event.

4. The process of fabrication is also compatible with non-salicide protection circuits.

While the invention has been described by way of example and in terms of preferred embodiments, it is to be understood that the invention is not limited to the disclosed embodiments. To the contrary, it is intended to cover various modifications and similar arrangements included within the spirit and scope of the appended claims. The scope of the claims should be accorded the broadest interpretation so as to encompass all such modifications and similar structures.

What is claimed is:

1. A metal-oxide semiconductor transistor structure, comprising:

a silicon substrate;

a drain diffusion region formed in said silicon substrate, said drain diffusion region having a diffusion resistance;

a source diffusion region formed in said silicon substrate;

a gate formed on said silicon substrate; and a plurality of isolated islands evenly distributed throughout a strip of said drain diffusion region adjacent to said gate, wherein each isolated island is positioned so as to block drain diffusion current in said drain diffusion region and is completely surrounded by said drain diffusion region, so as to restrict the flow of the drain diffusion current in the drain diffusion region around said isolated islands to increase the diffusion resistance of said drain diffusion region.

2. The metal-oxide semiconductor transistor structure of claim 1, wherein each of said isolated islands comprises an oxide layer formed on top of said silicon substrate and a polysilicon layer formed on top of said oxide layer.

3. The metal-oxide semiconductor transistor structure of claim 1, including a field oxide layer, wherein said plurality of isolated islands form said field oxide layer.

4. The metal-oxide semiconductor transistor structure of claim 1, wherein each of said plurality of isolated islands has substantially a same length and substantially a same width.

5. The metal-oxide semiconductor transistor structure of claim 4, wherein each of said plurality of isolated islands has a width of about 0.75 μm.

6. The metal-oxide semiconductor transistor structure of claim 4, wherein the distance between any two consecutive isolated islands is about 1.5 μm.

7. The metal-oxide semiconductor transistor structure of claim 4, wherein said plurality of isolated islands are arranged in rows in said drain diffusion region, and each row of said isolated islands includes more than one isolated island.

8. The metal-oxide semiconductor transistor structure of claim 7, wherein the pitch in each of said rows of isolated islands is about 10 μm.

9. The metal-oxide semiconductor transistor structure of claim 7, wherein the distance between the gate of said transistor and its closest row of isolated islands is about 0.75 μm.

10. The metal-oxide semiconductor transistor structure of claim 1, further comprising metallization on the substrate having drain contacts; said plurality of isolated islands providing substantially uniform diffusion resistance between said drain contacts and said gate.

11. The metal-oxide semiconductor transistor structure of claim 1, wherein each of said plurality of isolated islands has a substantially elongated shape that is substantially in parallel to an elongated edge of said gate.

12. In an integrated circuit device having a silicon substrate and an electro-static discharge protection circuit, the improvement wherein the discharge protection circuit includes a metal-oxide semiconductor transistor structure comprising:

a drain diffusion region formed in said silicon substrate;

a source diffusion region formed in said silicon substrate;

a gate formed on said silicon substrate; and means, including a plurality of isolated islands evenly distributed throughout a strip of said drain diffusion region adjacent to said gate, wherein each isolated island is positioned so as to block drain diffusion current in said drain diffusion region and is completely surrounded by said drain diffusion region, for restricting the flow of the drain diffusion current in the drain diffusion region around said isolated islands to increase the diffusion resistance of said drain diffusion region.

13. The circuit device of claim 12, further comprising metallization on the substrate having drain contacts; said plurality of isolated islands providing substantially uniform diffusion resistance between said drain contacts and said gate.

14. The circuit device of claim 13, further comprising metallization on the substrate having contacts; said plurality of isolated islands providing substantially uniform diffusion resistance between said contacts and said gate.

15. The circuit device of claim 12, wherein said metal-oxide semiconductor transistor structure is fabricated by a salicide fabrication procedure.

16. The circuit device of claim 12, wherein each of said isolated islands comprises an oxide layer formed on top of said silicon substrate and a polysilicon layer formed on top of said oxide layer.

17. The circuit device of claim 12, wherein the transistor has a field oxide layer and said plurality of isolated islands form said field oxide layer.

18. The circuit device of claim 12, wherein each of said plurality of isolated islands has substantially a same length and substantially a same width.

19. The circuit device of claim 18, wherein each of said plurality of isolated islands has a length of about 8.5 µm.

20. The circuit device of claim 18, wherein each of said plurality of isolated islands has a width of about 0.75 µm.

21. The circuit device of claim 20, wherein the isolated islands in each of said rows have a pitch of about 10 µm.

22. The circuit device of claim 18, wherein the distance between any two consecutive isolated islands is about 1.5 µm.

23. The circuit device of claim 18, wherein the isolated islands are arranged in rows in said drain diffusion region, and each row of said isolated islands includes more than one isolated island.

24. The circuit device of claim 23, wherein said rows includes a row closest to said gate and wherein a distance between said gate and the closest row is about 0.75 µm.

25. The circuit device of claim 23, wherein in each pair rows that are immediately to each other, a center of each isolated island in one of the pair of rows is substantially aligned with a center of a space between two consecutive isolated islands in the other of the pair of rows, and a center of each isolated island in said other of the pair of rows is substantially aligned with a center of a space between two consecutive isolated islands in the one of the pair of rows.

* * * * *